(12) United States Patent
Lee et al.

(10) Patent No.: US 8,768,267 B2
(45) Date of Patent: Jul. 1, 2014

(54) SWITCHLESS BAND SEPARATION FOR TRANSCEIVERS

(75) Inventors: Woo Yong Lee, San Diego, CA (US); Ajay Gummalla, Sunnyvale, CA (US); Maha Achour, Encinitas, CA (US); Cheng Jung Lee, Santa Clara, CA (US)

(73) Assignee: Hollinworth Fund, L.L.C., Dover, DE (US)

( * ) Notice: Subject to any disclaimer, the term of this patent is extended or adjusted under 35 U.S.C. 154(b) by 696 days.

(21) Appl. No.: 13/020,204

(22) Filed: Feb. 3, 2011

(65) Prior Publication Data
US 2011/0210787 A1 Sep. 1, 2011

Related U.S. Application Data

(60) Provisional application No. 61/301,050, filed on Feb. 3, 2010.

(51) Int. Cl.
*H04B 1/38* (2006.01)

(52) U.S. Cl.
USPC ............. 455/73; 455/107; 455/103; 330/126; 333/129

(58) Field of Classification Search
USPC ........................................ 330/126; 455/78, 73
See application file for complete search history.

(56) References Cited

U.S. PATENT DOCUMENTS

| | | | |
|---|---|---|---|
| 5,767,812 A * | 6/1998 | Basciano et al. | 343/722 |
| 7,592,952 B2 | 9/2009 | Vacher | |
| 7,764,232 B2 | 7/2010 | Achour et al. | |
| 2004/0127178 A1 * | 7/2004 | Kuffner | 455/133 |
| 2004/0134614 A1 * | 7/2004 | Jevtic et al. | 156/345.43 |
| 2005/0170790 A1 * | 8/2005 | Chang et al. | 455/90.3 |
| 2005/0206567 A1 * | 9/2005 | Torimoto et al. | 342/457 |
| 2006/0055485 A1 * | 3/2006 | Lobeek | 333/133 |
| 2006/0276158 A1 * | 12/2006 | Okabe | 455/333 |
| 2007/0243832 A1 | 10/2007 | Park et al. | |
| 2008/0242235 A1 * | 10/2008 | Adler et al. | 455/73 |
| 2009/0128446 A1 | 5/2009 | Gummalla et al. | |
| 2009/0135087 A1 | 5/2009 | Gummalla et al. | |

(Continued)

OTHER PUBLICATIONS

Sowlati et al., "Single-Chip Multiband WCDMA/HSDPA/HSUPA/EGPRS Transceiver with Diversity Receiver and 3G DigRF Interface Without SAW Filters in Transmitter / 3G Receiver Paths," Proceeding of the 2009 IEEE ISSCC (International Solid-State Circuits Conference), pp. 116-118, published on Feb. 9, 2009.

*Primary Examiner* — Nay A Maung
*Assistant Examiner* — Erica Fleming-Hall
(74) *Attorney, Agent, or Firm* — Novak Druce Connolly Bove + Quigg LLP

(57) ABSTRACT

A system includes a plurality of band pass filters to pass signals in separated frequency bands to or from an antenna. A matching network provides characteristic impedances. The system is designed such that the configuration of the matching network and BPFs provides high impedance to the band pass filters for those routing paths other than the band pass path as these routing paths do not transmit or receive the signals at this particular pass band. The system is further designed such that the configuration of the matching network and BPFs provides minimal insertion loss for the band pass path of for transmission and receipt of signals at this particular pass band, where each routing path has a corresponding pass band. The matching network is for coupling to an amplifier, when frequency separation is needed at the output of the amplifier to the BPFs. In one embodiment an impedance network tunes the impedance by using varying length transmission lines.

19 Claims, 11 Drawing Sheets

(56) References Cited

U.S. PATENT DOCUMENTS

| | | |
|---|---|---|
| 2009/0295660 A1 | 12/2009 | Xu et al. |
| 2010/0157858 A1 | 6/2010 | Lee et al. |
| 2010/0203843 A1* | 8/2010 | Gorbachov ............... 455/78 |
| 2010/0207703 A1 | 8/2010 | Dupuy et al. |
| 2010/0210208 A1* | 8/2010 | Gorbachov ............... 455/41.2 |
| 2010/0210299 A1* | 8/2010 | Gorbachov ............... 455/552.1 |
| 2011/0043328 A1* | 2/2011 | Bassali ............... 340/5.71 |
| 2011/0175789 A1* | 7/2011 | Lee et al. ............... 343/853 |
| 2011/0248792 A1* | 10/2011 | Adler et al. ............... 333/101 |
| 2013/0002370 A1* | 1/2013 | Adler et al. ............... 333/101 |

* cited by examiner

US 8,768,267 B2

SWITCHLESS BAND SEPARATION FOR TRANSCEIVERS

RELATED APPLICATION

This application claims priority to U.S. Provisional Application Ser. No. 61/301,050, entitled "RF FRONT-END MODULE AND ANTENNA SYSTEM BASED ON WIDEBAND POWER AMPLIFIERS," filed Feb. 3, 2010, which is incorporated herein by reference in its entirety.

BACKGROUND

Conventional multiband transceivers use a single antenna for both transmit and receive signals. Several switches and/or duplexers are used to switch between multiple signal bands. In some transceivers, additional switches may be used for selecting transmit Tx and receive Rx paths. A duplexer in such as conventional system typically includes a pair of filters for Tx and Rx paths to transmit and process the Tx and Rx signals simultaneously.

DETAILED DESCRIPTION

Figure 1:
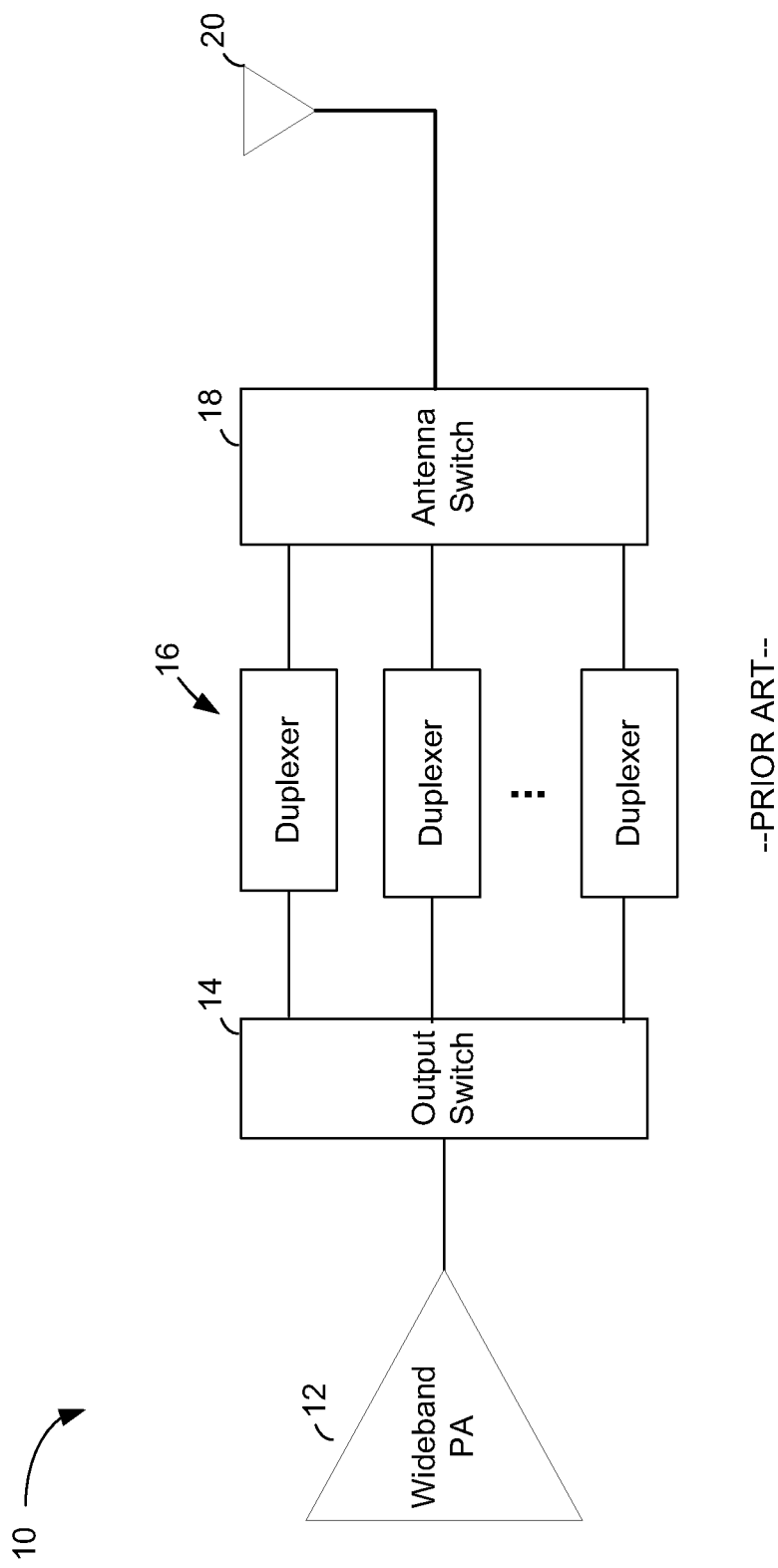
FIG. 1 is a block diagram of a Front End Module (FEM) in a wireless device, according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

As described herein, a system includes a plurality of Band Pass Filters (BPFs) to pass signals in separated frequency bands to or from an antenna. A first impedance network couples to the antenna and provides impedances to the band pass filters adapted to build high impedance for the paths of bands of the BPFs that do not transmit or receive the signals at the frequencies of interest. A second impedance network is for coupling to a power amplifier and provides impedances to the band pass filters adapted to build high impedance for the paths of bands of the BPFs that do not transmit or receive the signals at the frequencies of interest. Note that the first and second impedance networks may be considered different portions of a single impedance network.

Signals to be transmitted or received are provided separate impedance tuned paths with narrow band BPFs between signal processing circuitry and one or more antennas. Each impedance tuned path operates to provide low impedance to signals in a desired band, and high impedance to signals outside the desired band. Use of the impedance tuned paths in conjunction with the band pass filters provides the ability to use antennas for multiple bands without the need for switches or multiplexers.

In various embodiments, a transceiver includes separate Tx and Rx antennas and wideband power amplifiers, each supporting the multiple bands, without relying on switches for the signal path selection. Separated Tx and Rx antennas may provide better isolation between Tx and Rx paths than a single antenna with multiplexers. Further, embodiments allow for small frequency separations between the Tx bands.

In one embodiment, each impedance tuned path provides an impedance that transitions between an optimal impedance for transmitting signals having frequencies corresponding to the band pass filter band, and transitions to an open circuit for frequencies outside the band. The tuned impedance paths act as through transmission lines matched to a system characteristic impedance, e.g., 50Ω, thereby passing signals at desired frequencies without signal mixing but with maximum power transfer.

In one embodiment, a system includes a plurality of band pass filters and a matching network. The BPFs are to pass signals in separated frequency bands to or from an antenna. The matching network is structured to provide impedances to the plurality of BPFs. The matching network is also structured to route signals to each of the plurality of band pass filters as a function of signal frequency. In this way, each path has a pass frequency band, wherein frequencies outside that pass frequency band are routed to other paths. In some embodiments, the matching network includes a plurality of impedance tuned paths, wherein each of the impedance tuned paths provides characteristic impedance to signals in a pass frequency band, and high impedance to the paths outside the pass frequency band path, wherein each impedance tuned path having a different pass frequency band.

In various embodiments, the impedance paths may include a conventional microstrip having desired transmission line length to vary impedance, a phase shifter, such as a transmission line, a pi network, a T network, or a composite right/left hand (CRLH) structure which behaves as a Metamaterial, such structures are referred to as Metamaterial, MTM, or CRLH structures.

In some embodiments, a front end module and antenna system using wideband Power Amplifiers (PAs) and include a radio frequency integrated circuit (RFIC) with integrated Low Noise Amplifiers (LNAs) and the PAs and antennas are coupled to band pass filters by transmit and receive impedance matching networks respectively. Separate transmit and receive antennas may be coupled to the Band Pass Filter (BPF) or a single antenna multiplexed to the BPFs may be used. In various embodiments, Surface Acoustic Wave (SAW) filters, Bulk Acoustic Wave (BAW) filters and Film Bulk Acoustic Resonators (FBAR) are examples suitable to use as BPFs as they have sufficient quality factors to provide relatively small band separations. Out-of-band rejection and minimal insertion loss in the pass band are provided by SAWs, BAWs or FBARs. The combination of such BPFs together with the impedance matching network provides equivalent multiplexer functionality. In one embodiment, multiband Tx and Rx antennas may be physically separated to provide better isolation. Further, some embodiments may be configured to provide Tx-to-Rx isolation in the Tx band in the Rx side as well as Tx-to-Rx isolation in the Rx band in the Tx side in a full duplex system based on the band pass filters and impedance matching. Such wideband embodiments may cover various frequency bands associated with over-the-air protocols, such as Universal Mobile Telecommunications Systems (UMTS), Long Term Evolution (LTE), Code Division-Multiple Access (CDMA), and Global System for Mobile Communications (GSM) or others.

An example of a conventional multiband FEM and antenna system uses a single antenna for both transmit and receive signals covering the multi bands and multi-modes, and includes switches and an antenna switch module to select signal paths as well as duplexers to share one antenna coupled to the Tx and Rx paths. FIG. 1 illustrates a prior art system 10, having a wideband Power Amplifier (PA) 12, Such a conventional system includes switching mechanisms, such as switches 14, 18, coupled to multiple duplexers 16 for Tx and Rx paths to transmit and process the Tx and Rx signals through one antenna 20. Such a system processes multiple band frequencies, however, the configuration incurs excess cost adding to complexity, insertion loss, and space required to build such devices. In current wireless application, there is strong pressure to achieve smaller device size and reduced complexity.

Examples and implementations of multiband and multi-mode FEM with single antenna systems are given, for example, in the US patent Pub. No. US 2007/0243832 A1, entitled "MULTIMODE/MULTIBAND MOBILE STATION AND METHOD FOR OPERATING THE SAME," published on Oct. 18, 2007, and in the Proceeding of the 2009 IEEE ISSCC (International Solid-State Circuits Conference), pp. 116-118, entitled "Single-Chip Multiband WCDMA/HS-DPA/HSUPA/EGPRS Transceiver with Diversity Receiver and 3G DigRF Interface Without SAW Filters in Transmitter/3G Receiver Paths," by Tirdad Sowlati, et al., published on Feb. 9, 2009. In contrast, the system of FIG. 2 includes separate Tx and Rx antennas and wideband Pas (Low Band and High Band), each supporting the multiple bands, without relying on switches for the signal path selection and replaces switches in a conventional system with separate band pass filters (BPFs). Separated Tx and Rx antennas may provide better isolation between Tx and Rx paths than a single antenna with duplexers. Examples and implementations of FEM and antenna systems with separate Tx and Rx antennas without switches are given, for example, in the U.S. patent application Ser. No. 12/640,969, entitled "RF Front-End Modules and Antenna Systems," filed on Dec. 17, 2009.

Figure 2:
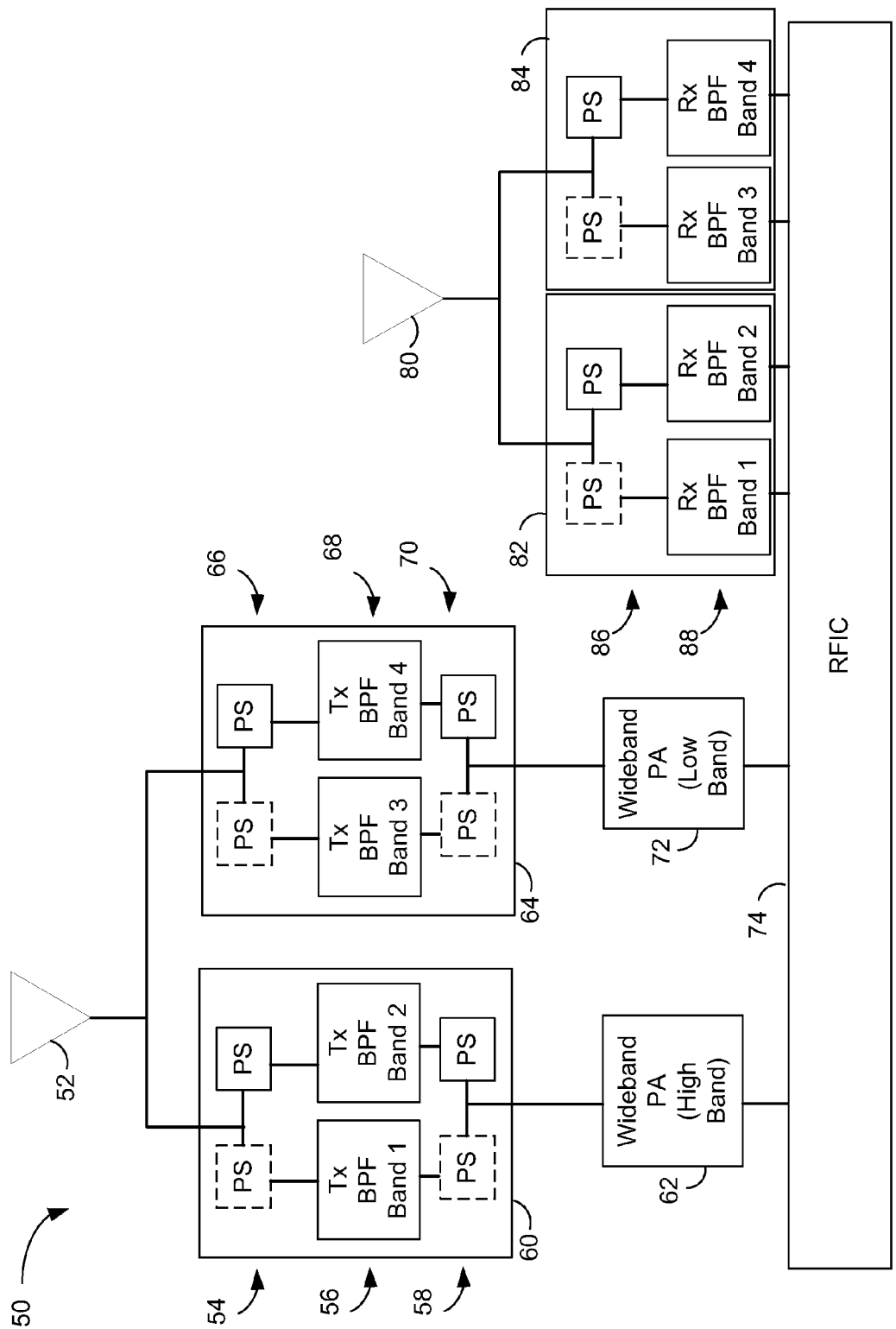
FIGS. 2-6 illustrate block diagrams of FEM and antenna systems in wireless devices, according to various example embodiment.

FIG. 2 illustrates a block diagram of an example of an RF front-end module (FEM) and antenna system 50 based on wideband power amplifiers (PAs) and multiple antennas according to example embodiments. The system 50 includes an RFIC 74 and is coupled to a transmit (Tx) antenna 52 and a receive (Rx) antenna 80. The system 50 may be used to support a wide frequency band including multiple sub-bands, such as up to ten Long Term Evolution (LTE)/Universal Mobile Telecommunications System (UMTS) bands and four Global System for Mobile Communications (GSM) bands, for example. The RFIC 74, the Tx antenna 52, PA 62, and PA 72 are configured to support a wideband frequency range for a variety of applications. For simplicity, four bands in the Tx path and four bands in the Rx path are considered in the example shown in FIG. 2. The multiband Tx and Rx antennas 52, 80 used in the system of FIG. 2 may be designed based on Composite Right/Left Handed (CRLH) structures, such as described in the U.S. patent application Ser. No. 11/741,674 entitled "Antennas, Devices and Systems based on Metamaterial Structures," filed on Apr. 27, 2007; U.S. Pat. No. 7,592,952 entitled "Antennas Based on Metamaterial Structures," issued on Sep. 22, 2009; U.S. patent application Ser. No. 12/250,477 entitled "Single-Layer Metallization and Via-Less Metamaterial Structures," filed on Oct. 13, 2008; U.S. patent application Ser. No. 12/270,410 entitled "Metamaterial Structures with Multilayer Metallization and Via," filed on Nov. 13, 2008; and U.S. patent application Ser. No. 12/465,571 entitled "Non-Planar Metamaterial Antenna Structures," filed on May 13, 2009. Examples of wideband PAs include class-J PAs and PAs with a distributed power architecture. Examples and implementations of metamaterial-based class-J PAs are given for example, in the U.S. patent application Ser. No. 12/708,437 entitled "Metamaterial Power Amplifier Systems" filed on Feb. 18, 2010 (claiming priority to the U.S. Provisional Patent Application Ser. No. 61/153,398 entitled "A Metamaterial Power Amplifier System and Method for Generating Highly Efficient and Linear Multi-Band Power Amplifiers," filed on Feb. 18, 2009. Examples and implementations of PAs with a distributed power architecture, such as Adaptive Current-draw Envelop-detection PA (ACE PA), are given, for example, in the U.S. patent application Ser. No. 12/473,228 entitled "RF Power Amplifiers with Linearization," filed on May 27, 2009.

Various embodiments may be extended to a multiport antenna configuration to separate the high band and low band without using switches, for example, for a wider band coverage. Examples and implementations of multiport antennas are given, for example, in the US Provisional Application Serial No. 61/259,589 entitled "Multiport Frequency band Coupled Antennas," filed on Nov. 9, 2009.

In the system of FIG. 2, the PA 62 is used to amplify signals in a high band (HB) that includes two sub-bands, Band 1 and Band 2; the PA 72 is used to amplify signals in a low band (LB) that includes two sub-bands, Band 3 and Band 4. The input signals in the sub-bands Band 1 and Band 2 may be sent to the PA 62 simultaneously or in different time intervals. The amplified HB signals are then sent to a dual band filter 60 for one of the HB Tx bands. The filter 60 includes two separate branches from the single input port coupled to PA 62, wherein each branch has a BPF 56 and a Phase Shifter (PS) 58 on the input side of the BPF 56 and a PS 54 on the output side of the BPF 56. The two BPFs 56 are configured to perform out-of-band rejections for respective bands, i.e., Band 1 and Band 2, to remove unwanted signals. The two PSs 58 on the input side of the BPFs 56 are configured to provide frequency band selection and direct the signals in the respective bands to the right paths based on phase adjustments, as explained later in this document. These branches are then connected to a feed point so that the signals in the Band 1 and the signals in the Band 2 are sent to the Tx antenna 52. The PS 54 is coupled between the output of each BPF 56 in the dual band filter 60 and the feed point to antenna 52. The output side PS 54 in the dual band filter 60 is configured to direct the signals in the respective bands to the Tx antenna 52 and prevent signal leakages into wrong paths.

Similar to the HB processing, the amplified LB signals are sent to a dual band filter 64 for the LB Tx bands, which includes a BPF 68 and two phase shifters, 66, 70 on each branch. Signals are processed in dual band filter 64 and then sent to the Tx antenna 52.

The Rx antenna 80 is configured to receive signals in the Rx path over the four bands, Band1 (HB), Band 2 (HB), Band 3 (LB) and Band 4 (LB). The received HB signals are sent to dual band diplexer 82, the received LB signals are sent to a dual band diplexer 84, each having two separate branches to accommodate each of the different frequency bands. For example, each path of diplexer 82 (HB), has Rx BPFs 88 and PSs 86 on the input side of the BPF, coupled to the RFIC 74 to output the received signals. The BPFs 88 are configured to perform out-of-band rejections for the respective bands to remove unwanted signals. The PSs 86 are configured to provide frequency band selection and direct the signals in the respective bands to the proper paths based on phase, as explained later. Furthermore, the combination of BPFs 88 and PSs 86 is configured to provide adequate isolation to prevent power leakage among different paths. Examples and implementations of isolation circuits for FEM and antenna systems for multiband operations are given for example, in the U.S. patent application Ser. No. 12/640,969, entitled "RF Front-End Modules and Antenna Systems," filed on Dec. 17, 2009. Similarly, the received LB signals are processed with a diplexer having two BPFs coupled with two phase shifters.

Configurations such as those of FIG. 2, provide a solution which avoids the use of switching in handling multiple frequency bands with one transmit antenna and one receive antenna. Other configurations may be similarly configured to accommodate a variety of frequency bands and satisfy a variety of specifications.

Figure 3:
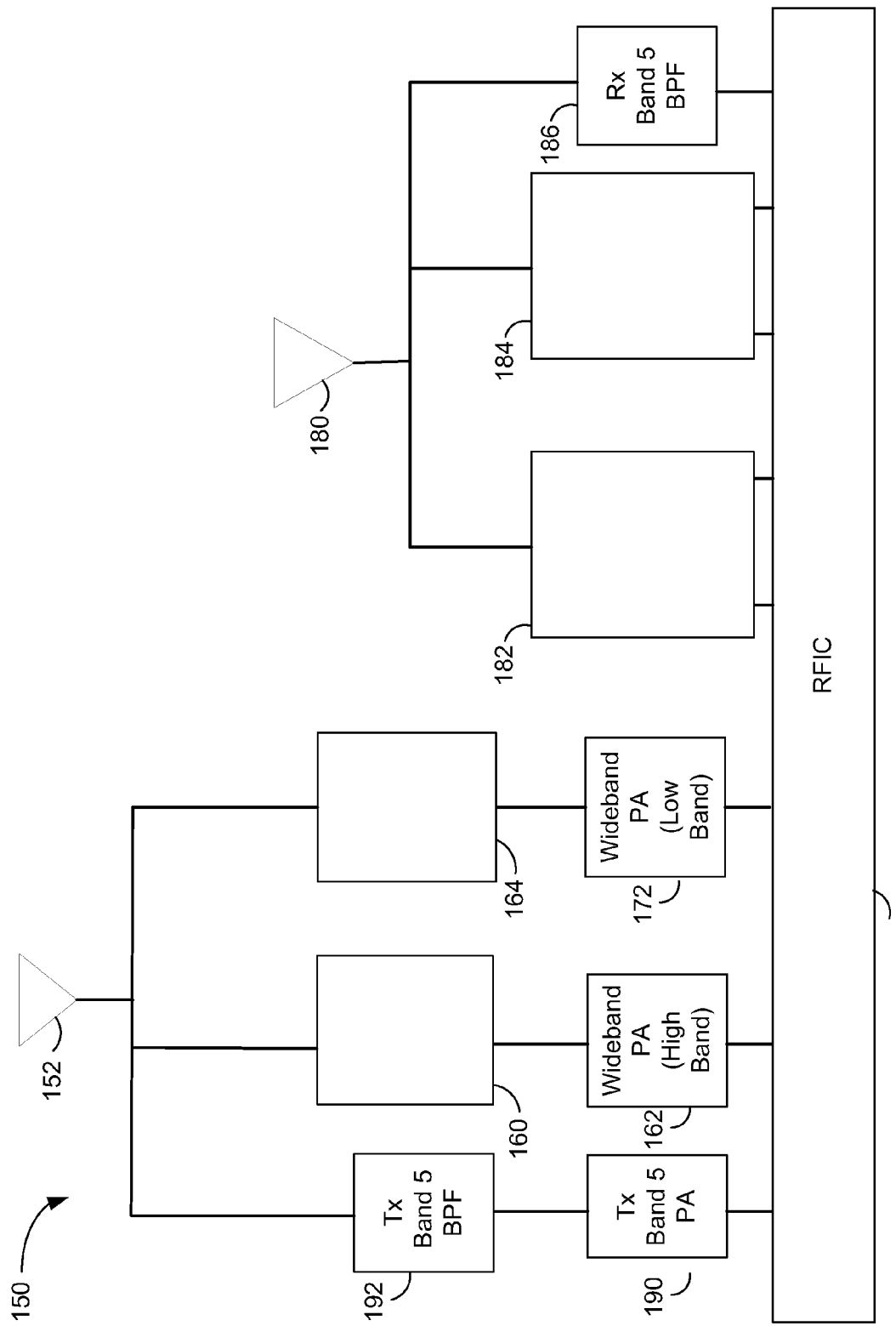

FIG. 3 illustrates a block diagram of another example of an RF FEM and antenna system based on wideband PAs and multiple antennas according to various embodiments. For instance, two antennas, one for transmit and the other for receive may be used. The system 150 of FIG. 3 is similar to system 50 of FIG. 2, but is additionally configured to handle a fifth Tx band, Band 5. In one example, Band 5 may be much higher than the Tx Band 1 and Band 2, such as a 2.6GHz band. A PA 190 operable for Band 5 is coupled to RFIC 174. The system of FIG. 3 is configured also to handle the corresponding fifth Rx band, Band 5. In the illustrated example, both the Tx antenna 152 and the Rx antenna 180 are configured to have a tri-port coupling to the components of the FEM. For clarity of understanding the dual band filters 160 and 164 and diplexers 182 and 184 are shown as functional blocks, and may be configured as filters 60 and 64 and diplexers 82 and 84 of FIG. 2.

Figure 4:
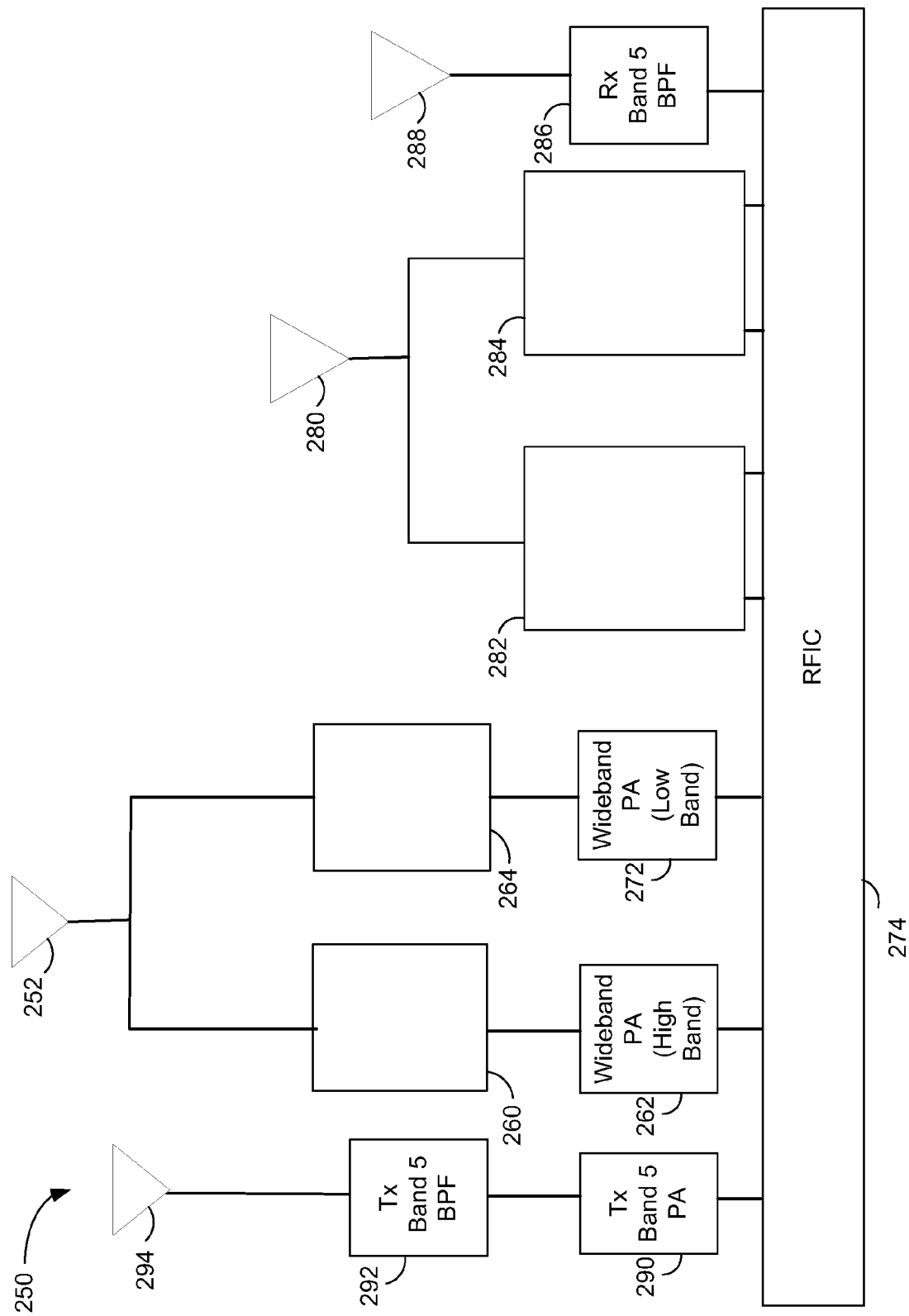

FIG. 4 illustrates a block diagram of a similar example of an RF FEM and antenna system 150 based on wideband PAs 262, 272, filters 260, 264, diplexers 282, 284, RFIC 274 and multiple Tx and Rx antennas 252, 280, according to example embodiments. In this case, Band 5 transmissions use designated Tx and Rx antennas, 294, 288, making the total number of antennas four. System 250 is similar to system 150 of FIG. 3, with Band 5 having separate antennas and signal paths.

Figure 5:
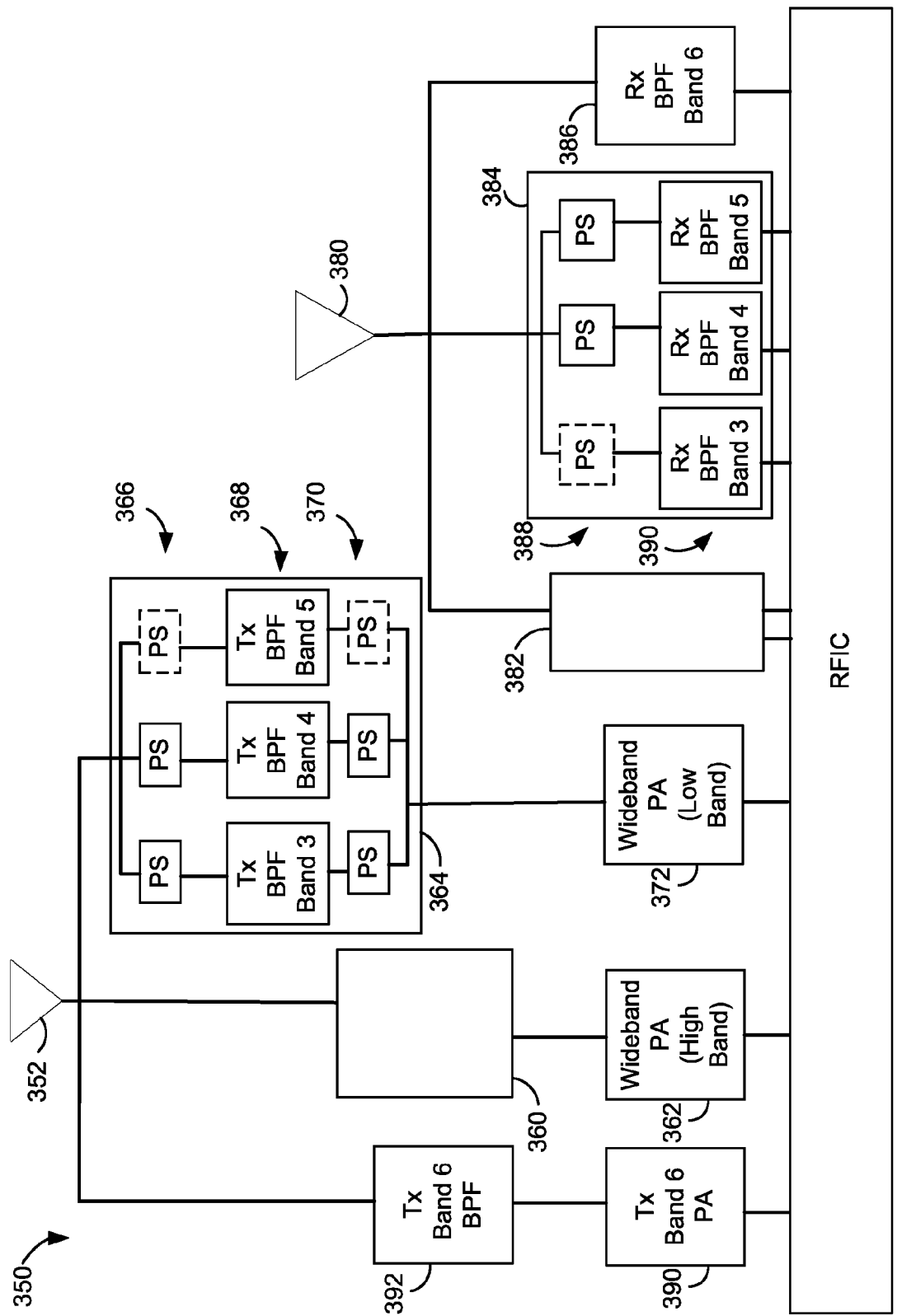

FIG. 5 illustrates a block diagram of yet another example of an RF FEM and antenna system based on wideband PAs and multiple antennas according to to various embodiments. Here the HB includes two frequency bands, the LB includes three frequency bands and there is an additional Band 6, which is processed individually. System 350 is similar to systems 150, 250, wherein dual filter 360 is similar to filter 60 of FIG. 2, RFIC 374 is similar to RFIC 74 and diplexer 382 is similar to diplexer 82 of FIG. 2. The HB signals are processed by Tx HB PA 362, dual filter 360 and antenna 352. The Band 6 signals are processed by the PA 390, BPF 392 and antenna 352. The LB Tx band has three sub-bands in this example. Accordingly, the LB PA 372 is configured to operate for the three bands, and is coupled to a tri-band filter 364 for the LB Tx band, which includes three paths, each having a BPF 368 positioned between two PSs 366, 370. All of the Tx bands are transmitted via antenna 352.

Continuing with FIG. 5, the antenna 380 receives signals from the HB, LB and Band 6. For the LB Rx band, a triplexer 384 is used in the system to handle the three sub-bands in the LB Rx band; the triplexer 384 includes a BPF 390 and a PS 388 on each branch. The diplexer 382 is similar to diplexer 82 of FIG. 2 and handles the two HB frequency bands. Band 6 is received and processed by BPF 386.

Figure 6:
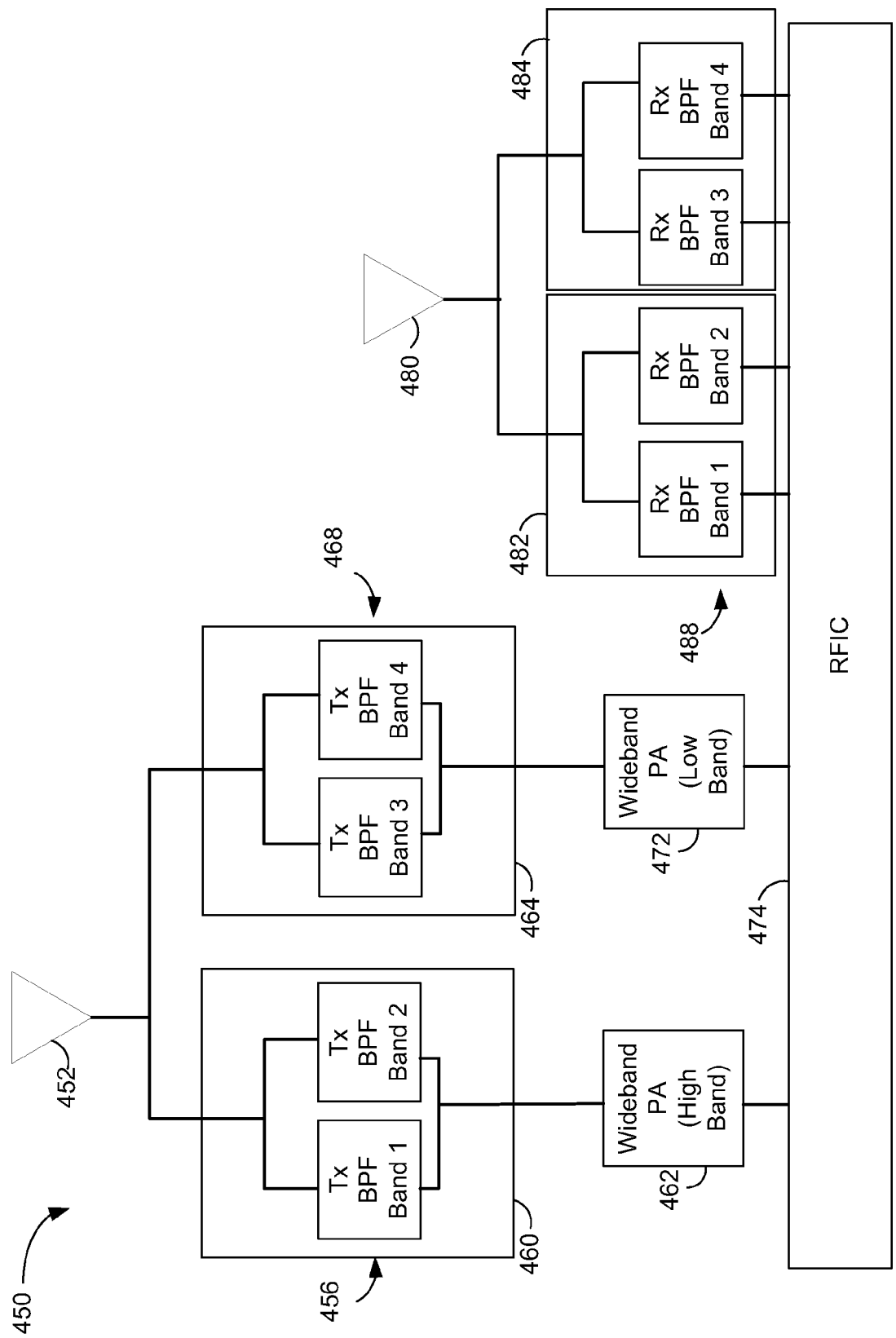

FIG. 6 illustrates a block diagram of yet another example of an RF FEM and antenna system 450 based on wideband PAs 462, 472, an RFIC 474, and having a Tx antenna 452, and a Rx antenna 480 according to an example embodiment. In this example, the input and output PSs are integrated with the BPF to form PS-integrated BPF 456, 468 on each branch of each of the dual-band filters 460, 464 for the Tx bands. Similarly, the PS is integrated with the BPF 488 on one branch in each of the diplexers 482, 484 for the Rx bands. Alternatively, a BPF may be designed for the right phase adjustment to route the signal properly instead of using a dedicated phase shifter.

Figure 7:
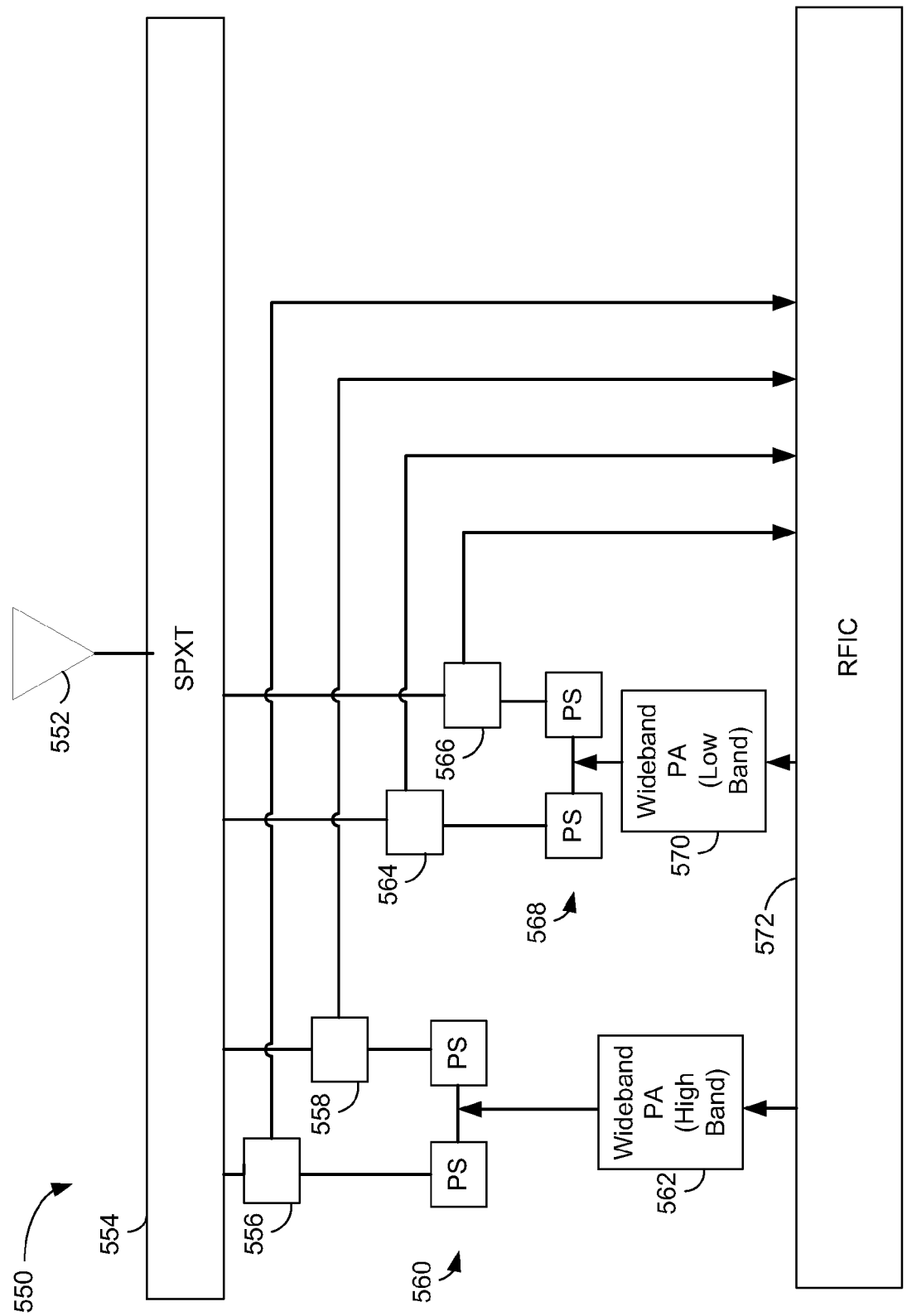
FIG. 7-8 illustrates signal routing in a wireless system, according to an example embodiment.

FIG. 7 illustrates a block diagram of an example of an RF FEM and antenna system 550 based on wideband PAs 562, 570, an RFIC 572, and a single antenna 552 according to an example embodiment. In this example, the single antenna 552 is used for the multiband operation for both Tx and Rx transmissions, and a duplexers 556, 558, 564, 566 are used for the Tx and Rx transmissions in respective bands. Thus, the signal path selection is carried out by a switch denoted SPXT 554 configured between the duplexers and the antenna 552. For the HB band, two PSs 560 along with duplexers 556, 558 are used to split the signals from the HB PA 562 into two sub-bands. The PSs 560 are coupled to respective duplexers, 556, 558. The PSs may be integrated in the PA package, duplexer package, or both. The LB signals are processed in a similar manner, wherein Tx signals are provided from PA 570 to PS 568, each coupled to one of duplexers 564, 566.

Figure 8:
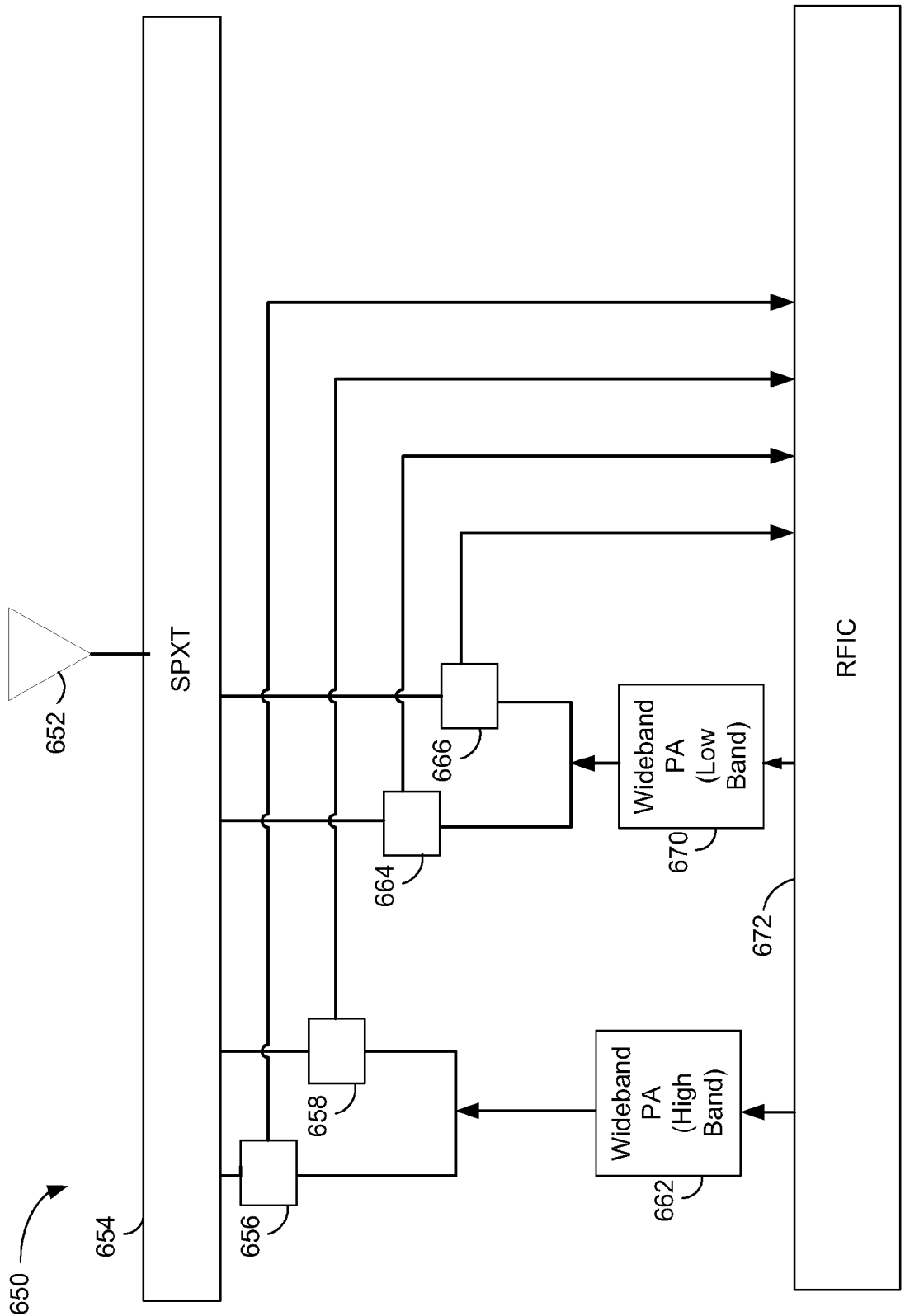

FIG. 8 illustrates a block diagram of another example of an RF FEM and antenna system 650 based on wideband PAs 662, 670, an RFIC 672 and a single antenna 652 according to an example embodiment. In this example, the duplexers 656, 658, 664, 666 in each of the HB and LB bands are integrated with the corresponding PA. The PSs may be already integrated in the PA package, duplexer package, or both. Furthermore, the Tx BPF of the duplexers may be designed for the right phase adjustment to route the signal properly instead of using a dedicated phase shifter.

Figure 9:
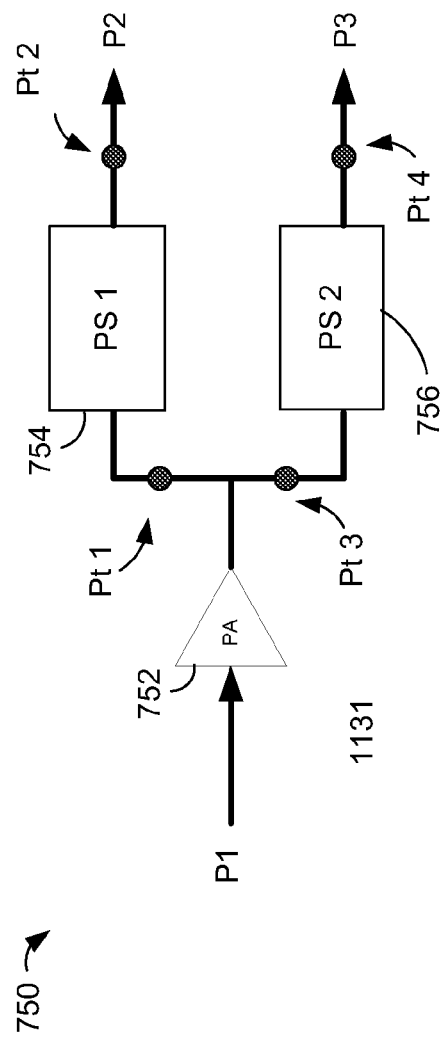
FIG. 9 illustrates signal routing in a FEM system, according to an example embodiment.

FIG. 9 schematically illustrates the signal routing scheme realized by the phase shifters in the systems described above. For simplicity, the Tx signal transmission associated with one PA is shown in this figure. The band includes two sub-bands, which are represented by frequencies $f_1$ and $f_2$, in this example, but may include three or more sub-bands. The signals in this band are inputted from the port P1 to the PA 752, which is a wideband PA capable of handling the two sub-bands $f_1$ and $f_2$. The input signals may be fed simultaneously or at different time intervals. However, to avoid inter-modulations associated with the PA 752, the signals in the different sub-bands may be fed at different time intervals. Furthermore, service standards typically use only one sub-band at a time interval. However, with the possible advent of new technologies and new market demands, the transmission scheme may evolve to include simultaneous transmission of multi-band signals from a single port. The amplified signals $f_1$ or $f_2$ are outputted from the PA 204. In order to pass the signal with $f_1$ through the upper branch to the port P2, the phase of the phase shifter PS 2 756 may be configured to transform an impedance (e.g., some value away from 50Ω) at Pt 4 to an open (or some high impedance) at Pt 3 at frequency $f_1$, thereby acting as an impedance transformer. The impedance at Pt 4 at frequency $f_1$ is much different from the characteristic impedance of a phase shifter, i.e., some value way from 50Ω. Thus, it is possible for the phase shifter to transform the impedance from the impedance at Pt 4 to an open (or high impedance) at Pt 3. In this configuration, the lower branch is decoupled from the signal path so that the phase shifter PS1 754 acts as a through transmission line matched to an characteristic impedance, e.g., 50Ω, thereby passing the $f_1$ signal without signal leaking but with maximum power transfer. Similarly, in order to pass the signal with $f_2$ through the lower branch to the port P3, the phase of the phase shifter PS 1 754 may be configured to transform an impedance (e.g., some value different from 50 Ω) at the Pt 2 to an open (or some high impedance) at the Pt 1 at frequency $f_2$. In this configuration, the upper branch is decoupled from the signal path so that the phase shifter PS2 756 acts as a through transmission line matched to an characteristic impedance, e.g., 50Ω, thereby passing the $f_2$ signal without signal leaking but with maximum power transfer. The phase shifter configured as above may be implemented using a conventional microstrip, a pi network, a T network, or a CRLH structure.

According to various embodiment, the FEM and antenna system including wideband PAs is structured by means of the frequency band selection scheme based on PSs, thereby eliminating active switches and associated drive circuitry. Surface Acoustic Wave (SAW) filters, Bulk Acoustic Wave (BAW) filters and Film Bulk Acoustic Resonators (FBAR) are examples suitable to use for the BPFs in systems having relatively small band separations. This is because good out-of-band rejection and insertion loss in the pass band are achievable using SAWs, BAWs or FBARs, which are capable of providing the multiplexer function in conjunction with the phase shifters. In the multiple-antenna systems described in this document, the multiband Tx and Rx antennas are physically separated and thus provide better isolation. Further, some of the present systems are configured to provide the Tx to Rx isolation in the Tx band and the Tx to Rx isolation in the Rx band in the full duplex system based on the BPFs and PSs. The wideband may cover UMTS, LTE, and GSM bands or various other communication bands.

It is possible to integrate the input and output phase shifters in a BPF package. The phase shifters on the input side may be integrated in a PA. The phase shifters on the output side may be integrated as a part of the antenna feeding point. The multiband multimode FEM system using wideband PAs and a combination of BPFs and PSs as a dual-band element may be extended to a tri-band element. For example, the tri-port multiband antenna having a low-band for 700-900MHz, a mid-band for 1700-1980MHz, and a high-band for 2300-2700MHz may allow this system to be extended to a tri-band platform.

Figure 10:
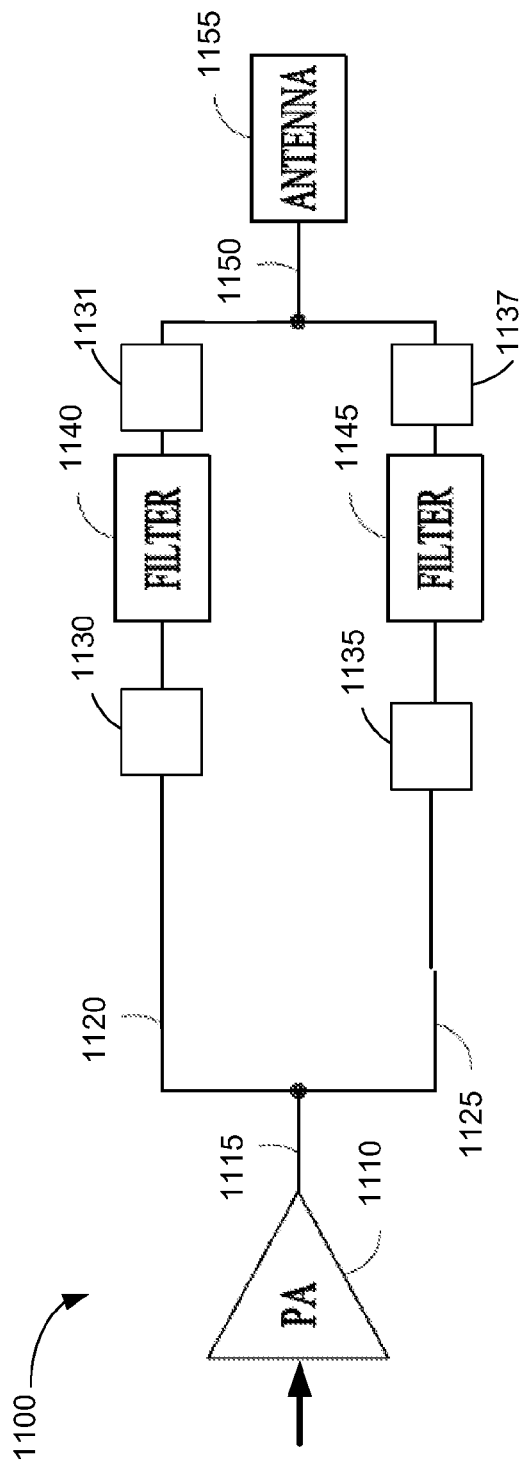
FIG. 10 illustrates a transceiver circuit, according to an example embodiment.

FIG. 10 further illustrates a block diagram of a transmit portion of a transceiver 1100. The block diagram is part of a FEM including PA 1110 coupled to matching networks 1130, 1131, 1135, and 1137. The matching networks may incorporate impedance elements and are configured in pairs on each side of a filter. For example, the matching network elements 1130, 1131 is configured for filter 1140, while the matching network elements 1135, 1127 are configured for filter 1145. Signals in transceiver 1100 are transmitted by antenna 1155. The PA 1110 receives signals to be transmitted, amplifies the signals, and provides them on an output line 1115. The amplified signals on output line 1115 may contain two or more signals to be transmitted. Each signal resides within a separate frequency band. In the case of two signals, as illustrated, the signals follow two separate impedance paths 1120 and 1125. Each path experiences an input impedance, which is configured to act as an open circuit for frequencies outside the pass band of a given filter. The transceiver components and conductive paths and connections may be incorporated in an integrated circuit, or may be printed on a circuit board.

The matching networks 1130, 1131 and 1135, 1137 are tuned to combine with the band pass filters to provide a tuned impedance path to provide low insertion loss for signals within the corresponding path of the pass band and high impedance for other paths. The tuned impedance paths act as transmission lines matched to a system characteristic impedance, e.g., 50Ω, thereby passing signals at desired frequencies without signal leaking but with maximum power transfer. Line 1150 provides a path for the output of networks 1131, 1137 to antenna 1155.

Figure 11:
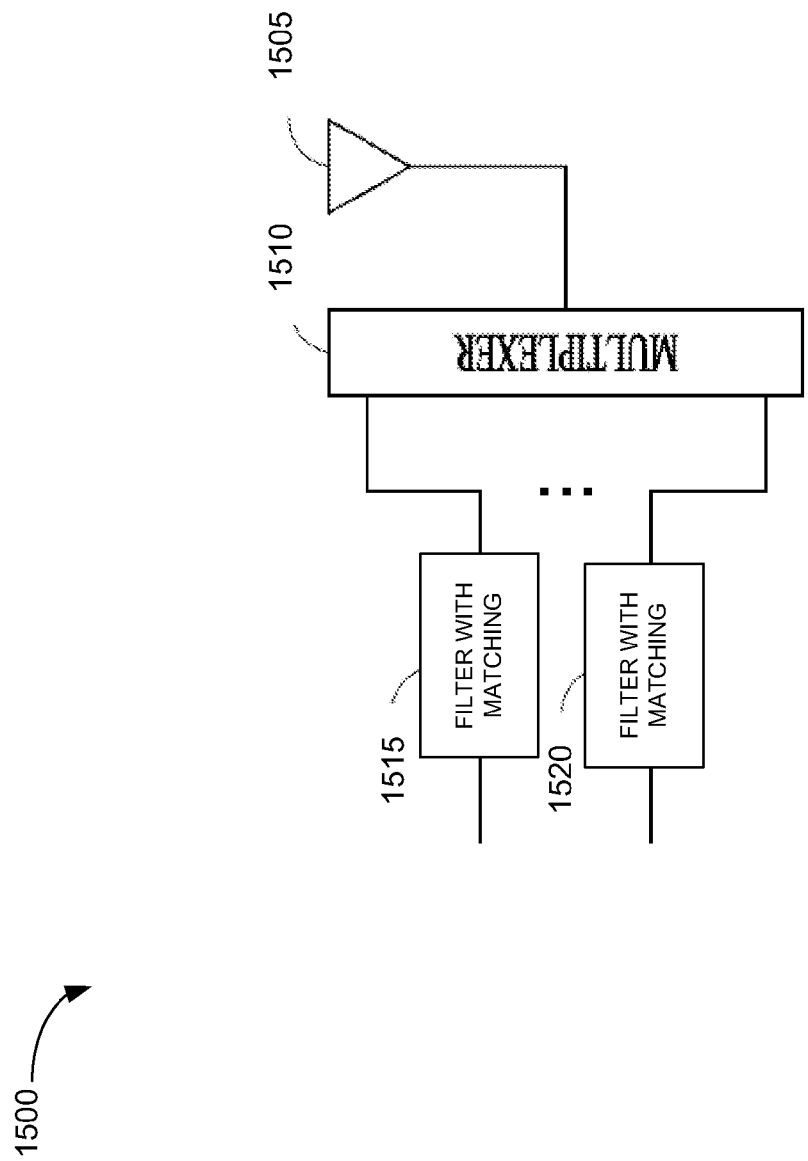
FIG. 11 illustrates a transceiver, according to an example embodiment.

FIG. 11 is a block diagram of a transceiver system 1500 with multiple paths (two are illustrated, but any number may be implemented) coupled to a multiplexer for use of a single radiating element or antenna 1505. Each path coupled to the multiplexer includes a matching-integrated filter for processing signals. The system 1500 may be implemented in some of the examples described herein. Filters 1515, 1520 input to multiplexer 1510.

Figure 12:
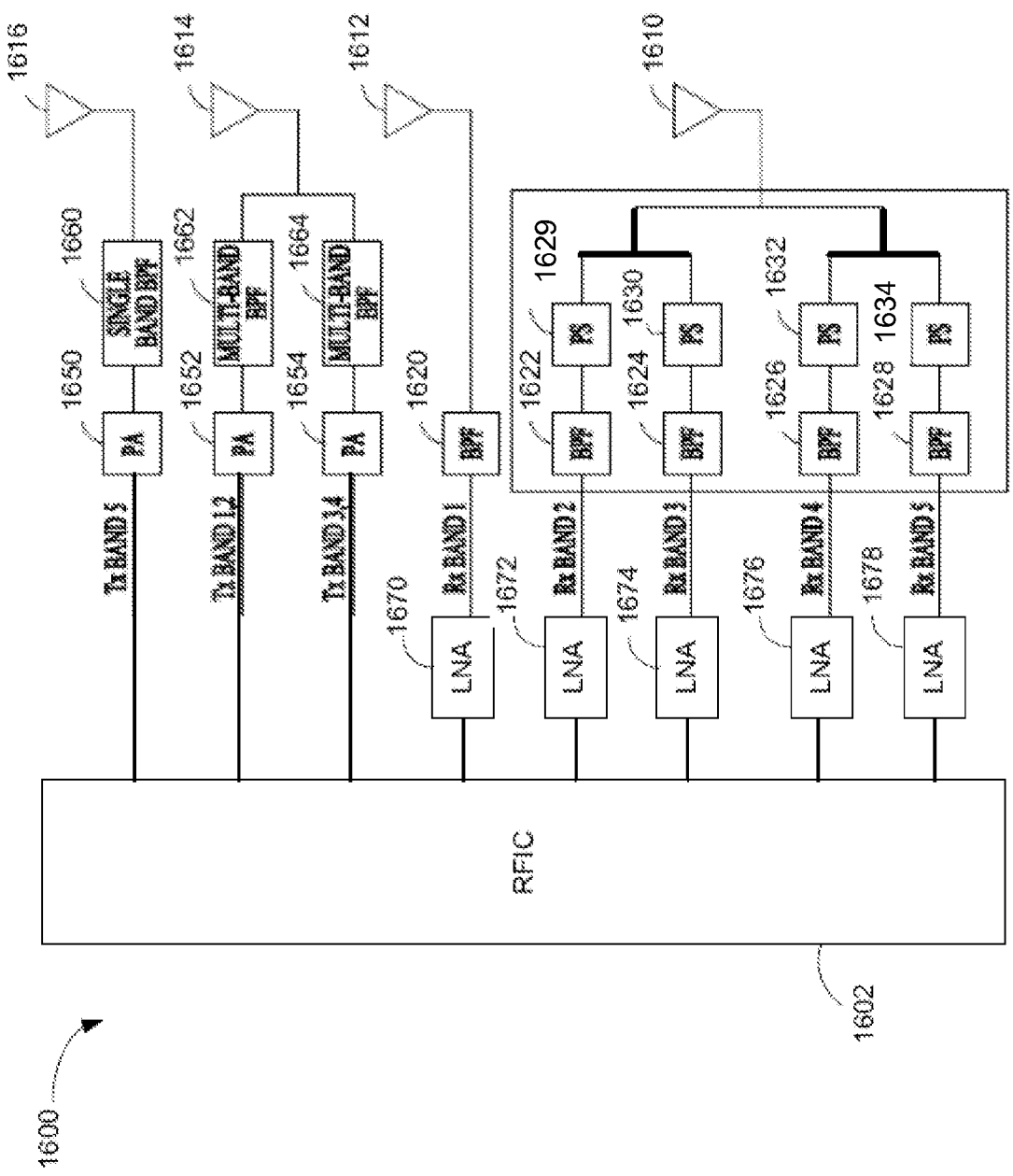
FIG. 12 illustrates a multi-band transceiver, according to an example embodiment.

FIG. 12 illustrates an example embodiment of a front end portion of a multiple band transceiver having separate high and low band paths. The circuit 1600 includes an RFIC 1602 which prepares transmission signals for communication over the air via the antennas 1610, 1612, 1614, 1616. The RFIC 1602 may include LNA(s), PA(s) and or other signal processing circuitry. The RFIC 1602 is configured to route both Tx and Rx signals as well as high band and low band signals. The Tx paths are routed through PAs 1650, 1652, 1654 and antennas 1614, 1616, according to frequency band. As illustrated, the circuit 1600 is configured and designed to process frequency bands identified as Band 1 through Band 5, each band having a designated Tx and Rx portion. Band 5 signals are processed by PA 1650 and the amplified signals are filtered by a single band BPF 1660, then provided to antenna element 1616. The BPF 1660 according to one embodiment is configured with multiple BPFs (not shown) configured in parallel, and each having a pair of phase shifters (not shown) configured at each port, input and output.

Bands 1 and 2 are processed by PA 1652 and the amplified signals are filtered by a multi-band BPF 1662, then provided to antenna element 1614. The BPF 1662 according to one embodiment is configured with multiple BPFs (not shown) configured in parallel, and each having a pair of phase shifters (not shown) coupled at each port, input and output.

Bands 3 and 4 are processed by PA 1654 and the amplified signals are filtered by a multi-band BPF 1664, then provided to antenna element 1614. The signals in bands 3 and 4 share antenna 1614 with signals in band 1 and 2. The BPF 1664 according to one embodiment is configured with multiple BPFs (not shown) configured in parallel, and each having a pair of phase shifters (not shown) coupled at each port, input and output. The embodiments and configurations discussed throughout this document may be combined and used in a variety of combinations to accommodate a variety of bands and operating criteria.

Receive processing is done by way of two antennas 1612, 1614. The circuit 1600 includes multiple BPFs 1620, 1622, 1624, 1626, 1628, each filtering a desired frequency of a received signal for the associated frequency band of bands 1, 2, 3, 4, and 5. Antenna 1612 is coupled directly to BPF 1620 which filters out band 1 signals. The filtered band 1 signals are provided to RFIC 1602 for further processing. Antenna 1610 is coupled to two paths, wherein a first path provides received signals to Phase Shifter (PS) 1634 and PS 1630, and the second path provides received signals to PS 1632 and PS 1634. The BPF 1622 filters band 2 signals; BPF 1624 filters band 3 signals; BPF 1626 filters band 4 signals; BPF 1628 filters band 5 signals. Each path further includes an LNA 1670, 1672, 1674, 1676, 1678. Application of impedance elements is adapted to cause high impedance of routing paths for other paths at the pass frequencies of the BPF. In the Tx paths, the impedance matching networks may coupled to an amplifier, such as a PA. The impedances may be implemented as a network of components in some embodiments.

The matching networks and impedance elements are designed and configured according to the frequency bands and components of a given system. While various configurations are provided, there are a variety of others which may be used. The matching network may employ any of a variety of techniques and components which are adapted to provide an input impedance that provides high impedance for undesired routing paths.

Only a few implementations are disclosed. However, it is understood that variations and enhancements may be made. In some embodiments, CRLH and MTM components are incorporated to improve performance and reduce the footprint of the circuitry. For example, one or more antennas may be implemented using CRLH structures. The circuitry and examples described herein may be particularly applicable to devices supporting a variety of over-the-air protocols and services, such as a wireless device supporting cellular communications, Wi-Fi local communications, GPS, and Bluetooth, or combinations of these. Such devices may reuse antennas or other components by implementation of additional elements.

The invention claimed is:

1. A system, comprising:
a signal source;
a first plurality of impedance matched networks connected to the signal source;
a plurality of band pass filters to pass signals in separated frequency bands, connected to respective ones of the first plurality of impedance matched networks; and
a second plurality of impedance matching networks, connected to respective ones of the plurality of band pass filters (BPF);
a transmit antenna connected to the second plurality of impedance matching networks;
wherein the first plurality of impedance matched networks is configured to provide frequency band selection and direct signals in respective band to the corresponding one of the plurality of band pass filters;
wherein the second plurality of impedance matched networks is configured to direct signals in the respective bands to the transmit antenna and prevent signal leakages into incorrect signal paths;
wherein the first and second matching networks are switchless.

2. The system of claim 1, wherein the first and second plurality of impedance matching networks comprises a plurality of impedance tuned paths, wherein each of the impedance tuned paths provides characteristic impedance to signals in a pass frequency band, and high impedance to the paths outside the pass frequency band path, wherein each impedance tuned path having a different pass frequency band.

3. The system of claim 2, wherein each of the impedance tuned paths has a different length transmission line structured to build high impedances for paths outside the pass frequency band path at frequencies in the pass frequency band.

4. The system of claim 1, wherein the first and second plurality of impedance matching networks in conjunction with the plurality of band pass filters supports multiple frequency bands without a switch.

5. The system of claim 1, wherein the first and second plurality of impedance matching networks includes at least one phase shifter to increase impedance to signals at the first band transmission frequencies to paths other than a first band path and to provide matched impedance to signals at the first band frequencies to the first band path.

6. The system of claim 1, further comprising a plurality of amplifiers coupled to the first and second plurality of impedance matching networks.

7. The system of claim 1, wherein the signal source is a power amplifier to amplify signals to be transmitted by an antenna coupled to an output of the plurality of BPFs.

8. The system of claim 1, wherein the first and second plurality of impedance matching networks comprises pairs of impedance elements positioned one each side of the plurality of BPFs.

9. A system comprising:
a power amplifier to amplify signals of multiple transmission frequency bands;
a transmit antenna to transmit the amplified signals;
a first plurality of transmit matching networks coupled to the power amplifier;
a plurality of transmit Band Pass Filters (BPFs) coupled to the transmit matching network, wherein the transmit matching network provides multiple impedances tuned to increase impedance to signals outside the transmission frequency bands;
a second plurality of transmit matching networks coupled to the plurality of band pass filters and the transmit antenna, and configured to direct signals in the respective bands to the transmit antenna and prevent signal leakages into incorrect signal paths;
a receive antenna to receive signals in receive frequency bands;
a low noise amplifier to amplify signals from the receive antenna;
a plurality of receive BPFs coupled between the receive matching network and the receive antenna, wherein the receive matching network provides multiple impedances tuned to increase impedance to signals outside the receive frequency bands; and
a receive matching network coupled to the low noise amplifier and the plurality of receive BPFs.

10. The system of claim 9, wherein the receive antenna and transmit antenna comprise a single antenna with a switch, the switch configured to switch between frequency bands of operation.

11. The system of claim 9, wherein the transmit matching network and the receive matching network include varying length transmission lines, in conjunction with the BPFs, to build high impedance to signals at pass band frequencies for routing paths other than the pass band path.

12. The system of claim 9, wherein the first plurality of transmit matching networks includes a plurality of phase shifters to increase impedance, in conjunction with the BPFs, to build high impedance to routing paths other than the pass band path for signals at pass band frequencies.

13. The system of claim 9, wherein the receiving matching network comprises pairs of impedance elements positioned one each side of the plurality of BPFs.

14. A method comprising:
receiving signals to be transmitted or amplified along a signal path;
first conducting the signals on the signal path through a first impedance tuning network;
filtering, after the first conducting, the signals on the signal path with multiple band pass filters; and
second conducting, after the filtering, the signals on the signal path through a second impedance tuning network;

tuning an impedance of the first and second impedance tuning network, comprising:
  increasing an impedance for the routing paths other than the pass band path for signals at the pass band frequencies having at least one of the multiple band pass filters; and
  matching an impedance for the pass band path for signals at pass band frequencies having at least one of the multiple band pass filters;
wherein the first impedance turning network is configured to provide frequency band selection and direct signals in respective bands to the filtering;
wherein the second impedance tuning network is configured to direct signals in the respective bands to a transmit antenna and prevent signal leakages into incorrect signal paths.

15. The method of claim 14, wherein the first and second impedance tuning networks are switchless.

16. The method of claim 14, wherein the first and second impedance tuning networks include varying length transmission lines.

17. The method of claim 14, wherein the first and second impedance tuning network includes phase shifters.

18. The method of claim 14, wherein the signal path includes a high band signal path and a low band signal path, the method further comprising:
  phase shifting signals on the low band signal path to separate the low band signal path from the high band signal path.

19. The method of claim 14, wherein the signal path includes a transmit signal path and a receive signal path, the method further comprising:
  conducting transmit signals on the transmit signal path; and
  conducting receive signals on the receive signal path.

* * * * *